United States Patent [19]

Chant

[11] Patent Number: 4,797,508

[45] Date of Patent: * Jan. 10, 1989

[54] METHOD FOR PRODUCING CIRCUIT BOARDS WITH DEPOSITED METAL PATTERNS AND CIRCUIT BOARDS PRODUCED THEREBY

[75] Inventor: Peter R. Chant, Burlington, Canada

[73] Assignee: Firan Corporation, Oakville, Canada

[*] Notice: The portion of the term of this patent subsequent to Nov. 17, 2004 has been disclaimed.

[21] Appl. No.: 90,043

[22] Filed: Aug. 31, 1987

Related U.S. Application Data

[63] Continuation-in-part of Ser. No. 909,256, Sep. 19, 1986, Pat. No. 4,707,394.

[51] Int. Cl.⁴ .......................... H05K 1/00; B32B 3/00; C23F 1/02; B29C 37/00
[52] U.S. Cl. ..................................... 174/68.5; 29/846; 156/150; 156/630; 156/634; 156/650; 156/656; 156/659.1; 156/668; 156/902; 427/96; 427/98; 428/209; 428/416; 428/601; 428/901
[58] Field of Search .......................... 174/68.5; 29/846; 156/150, 630, 634, 643, 650, 656, 659.1, 668, 901, 902; 428/156, 172, 209, 601, 416, 418, 901; 427/96, 98; 204/15, 30

[56] References Cited

U.S. PATENT DOCUMENTS

| | | | |
|---|---|---|---|
| 3,226,256 | 1/1963 | Schneble et al. | 427/96 |
| 3,312,754 | 4/1967 | Marks et al. | 260/837 |
| 3,625,758 | 12/1971 | Stahl et al. | 174/685 |
| 3,639,500 | 2/1972 | Muny et al. | 260/837 |
| 3,737,339 | 6/1973 | Alsberg et al. | 204/15 |
| 3,892,819 | 7/1975 | Najvar | 260/836 |
| 3,910,992 | 10/1975 | Skillicorn | 260/485 |
| 3,956,041 | 5/1976 | Polichette et al. | 156/237 |
| 4,254,186 | 3/1981 | Acitelli et al. | 428/462 |
| 4,374,868 | 2/1983 | Stahl et al. | 427/97 |
| 4,389,268 | 6/1983 | Oshima et al. | 156/150 |
| 4,402,998 | 9/1983 | Kumagai et al. | 427/97 |
| 4,469,777 | 9/1984 | O'Neil | 430/315 |
| 4,476,285 | 10/1984 | Crabtree et al. | 525/113 |
| 4,511,757 | 4/1985 | Ors et al. | 174/685 |
| 4,517,050 | 5/1985 | Johnson et al. | 156/643 |
| 4,707,394 | 11/1987 | Chant | 174/68.5 X |

Primary Examiner—Morris H. Nimmo

[57] ABSTRACT

A process for producing circuit boards involves the coating of a resinous substrate with a fluid mixture of an epoxy polymer component and a rubber polymer which is interactive therewith at temperatures of at least 180° F. Preferably the rubber is a low molecular weight polyfunctional reactive butadiene/acrylonitrile interpolymer which is terminated by vinyl or carboxyl functional groups. The rubber component comprises at least 70 percent by weight of the epoxy polymer component, and the coating has a thickness of 0.001–0.015 inch. The coating is partially cured to effect partial polymerization of the epoxy prepolymer, further polymerization of the rubber, if it is low molecular weight, and interaction of the rubber and epoxy polymer to form a matrix of the interacted rubber/epoxy. The exposed surface of this coating is then etched, and metal is deposited on the surface to form a conductive layer. A conductive pattern is formed therein, and heat and pressure are then applied to the conductive pattern and coating to fully cure the coating and bond the coating to the metal layer, and thus the conductive pattern to the resinous substrate. The metal layer may be deposited chemically or by vacuum metallizing and like techniques.

24 Claims, 1 Drawing Sheet

METHOD FOR PRODUCING CIRCUIT BOARDS WITH DEPOSITED METAL PATTERNS AND CIRCUIT BOARDS PRODUCED THEREBY

CROSS-REFERENCE TO RELATED APPLICATION

The present application is a continuation-in-part of application Ser. No. 06/909,256 filed Sept. 19, 1986, now U.S. Pat. No. 4,707,394 Nov. 17, 1987.

BACKGROUND OF THE INVENTION

The present invention relates to circuit boards, and more particularly to a novel process for producing circuit boards in which a conductive layer of metal forms a circuit pattern upon, and is firmly bonded to, a resinous substrate providing the support therefor, and to the well defined and bonded circuit boards which are produced thereby.

Various techniques have been utilized for generating printed circuit boards, including the lamination of foil to resinous or ceramic substrates and etching of the circuit pattern, the chemical deposition of the metal pattern from a plating solution, and the deposition of a conductive metal layer or pattern by vacuum metallization, sputtering, and like techniques, followed by electrodeposition of the thicker metal deposit of the circuit pattern.

Traditional copper-clad boards are manufactured using multiple layers of epoxy resin impregnated glass cloth which are pressed under heat and pressure together with copper foil to form a copper-clad laminate. To enhance the adhesion of the epoxy/glass prepreg to the copper, the contact surface of the copper is treated so as to form a rough oxide surface. The ultimate peel strength is defined both by mechanical adhesion of the reflowing epoxy during the pressing phase as it flows into the microrough oxide surface of the copper foil and also by the chemical adhesion of the epoxy resin to the copper oxide. These copper-clad boards are then used for the manufacture of printed circuit boards using subtractive processing, i.e., the removal of the copper between the desired circuit elements of the conductive pattern.

In an effort to obtain fine patterns with well defined edges, industry has been decreasing the thickness of the metal layer, and problems of obtaining good bond between the metal layer and the underlying substrate have been increasing. Thus, where line widths and spacings were commonly 0.008–0.015 inch several years ago, currently demands are being made for lines width and spacings of 0.003–0.007 inch and sometimes as little as 0.001 inch.

The smaller the width and the spacing, the thinner the metal layer must be for sharp definition. As is known, the thicker the copper deposit to be etched, the greater the extent of the etch-back. Therefore, to achieve fine lines, it is necessary to have a thin layer of copper to etch; the finer the desired lines, the thinner the copper. The production of foil laminated boards using an extremely thin copper layer necessary is impractical so that industry has turned to additive and semi-additive processing, i.e., the deposition of metal onto the substrate.

The main problem in such additive processing is one of the adhesion of the copper layer deposited onto a cured epoxy laminate. Because adhesion is not reversible, the peel strength will not be the same as that achieved in a foil/board laminate.

Many techniques and methods have been tried to overcome this deficiency, but none has fully overcome it in a practical, production-efficient way. Among the techniques which have been proposed to improve the bonding or peel strength between the metal layer and the underlying substrate are application of intermediate "adhesive" coatings and etching or roughening of the substrate before application of the metal layer, etc. Generally, these techniques have effected improvements in bond strength, but they have not produced uniformly good bonding and/or have involved substantial additional expense and processing difficulties.

It is an object of the present invention to provide a novel additive process for the production of circuit boards in which a thin metal layer is deposited upon and firmly bonded to an underlying resinous substrate.

It is also an object to provide such a process which inherently lends itself to the fabrication of miniaturized circuitry with good adhesion of the individual circuit portions to the underlying substrate.

Another object is to provide such a process which may be practiced relatively economically and expeditiously.

A further object is to provide circuit boards utilizing relatively thin metal deposits of relatively narrow width and close spacing to form the conductive pattern, and in which the conductive pattern is firmly bonded to a resinous substrate.

SUMMARY OF THE INVENTION

It has now been found that the foregoing and related objects can be readily attained in a process for producing circuit boards having a metallized circuit pattern firmly bonded to a resinous substrate, in which a resinous substrate is coated with a fluid mixture of a formulation containing an epoxy polymer component and a rubber component which is interactive therewith at temperatures of at least 180° F. The rubber component comprises 50–200 percent by weight of the epoxy polymer component, and the coating has a thickness of 0.0005–0.015 inch.

This coating is partially cured to produce partial cross-linking of the epoxy polymer component, and interaction of the rubber and the epoxy polymer. The exposed surface of the coating is etched to produce a microporous surface. Copper or other suitable metal is then deposited on the surface of the coating to form a conductive layer with microformations extending into the recesses of the microporous surface. Metal is then deposited thereon to form a conductive pattern on the copper layer. Heat and pressure are applied to the coating and to the metal deposit either before or after the electrodeposition of the metal to provide the conductive pattern to fully cure the coating, thereby firmly bonding the coating to the metal layer and thereby the metal pattern through the coating, to the resinous substrate.

Preferably, the rubber interpolymer is a low molecular weight polyfunctional reactive rubber component comprising an interpolymer of butadiene and acrylonitrile which is terminated by functional groups selected from vinyl and carboxyl. It has a Brookfield viscosity of 100,000–400,000 cps at 27° C. and preferably 120,000–300,000. The functional terminal groups interact with the epoxy polymer component during further polymerization thereof Desirably, the etching step utilizes a chemical etchant to attack the exposed surface and produce the microporous characteristic. Alternatively, the etching step may utilize a plasma to attack the exposed surface of the coating and produce the microporous characteristic.

In the preferred embodiment, the metal layer is deposited by a process of vacuum metallizing. Alternatively, the metal layer may be deposited by electroless chemical deposition from a plating solution, requiring preliminary surface activation of the coating.

The preferred coating compositions utilize a rubber component in which the terminal functional group is a vinyl group, and the rubber component comprises 100–200% by weight of the epoxy polymer component.

The step of partially curing the coating comprises developing a temperature of 250–350° F. in the coating for a period of at least 2 hours, and the step of fully curing the coating comprises developing a temperature in the coating of 280°–350° F. for a period of at least 2 hours. In the preferred process, the step of applying heat and pressure to finally cure the coating at least partially embeds the conductive pattern in the coating. Generally, a continuous layer of copper or other metal is initially deposited on the coating and thereafter selectively etched to remove the layer between the elements of the conductive pattern.

The final curing of the coating may be effected either before the electrodeposition of the metal to provide the full thickness of the conductive pattern or preferably thereafter to achieve increased mechanical adhesion by embedding in the coating at least a portion of the electrodeposited metal.

DETAILED DESCRIPTION OF THE PREFERRED EMBODIMENT

Figure 1:
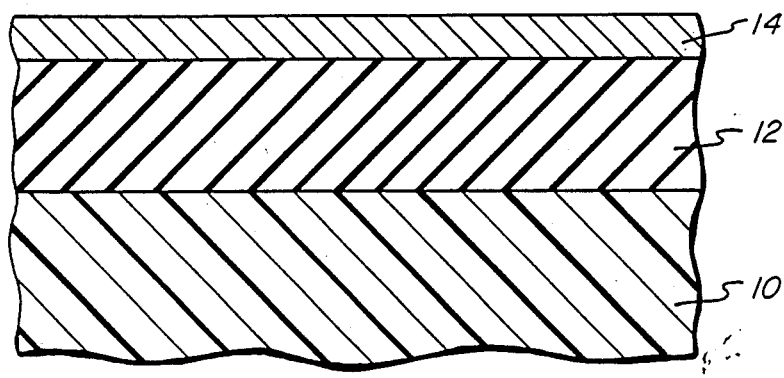
FIG. 1 is a fragmentary cross sectional view of a circuit board assembly during one point during the process of manufacture of the present invention with the components drawn to a greatly enlarged and somewhat distorted scale.

As has been previously indicated, the method of the present invention involves a series of steps to produce a final circuit board structure in which the conductive metal pattern is firmly bonded to the underlying substrate through an intermediate coating. In this process, generally the following steps are involved.

Initially, the substrate which will conventionally be a fiber-filled epoxy or other resinous substrate is coated with the special coating formulation of the present invention, and this coating is partially cured. The exposed surface of the coating is then etched to provide microporous surface characteristics, and a layer of metal is deposited on the surface of the coating. A thicker deposit of metal is formed thereon in the desired conductive pattern. Heat and pressure are applied to the conductive layer or pattern and the coating to fully cure the coating, to firmly bond the coating to the metal layer, and thereby to bond the metal pattern through the coating to the substrate.

The present invention utilizes conventional substrates to provide the strength and dimensional stability of the assembly circuit board. Generally, glass filled epoxy resin or other reinforced resinous materials are employed for such substrates. It is also possible to use ceramic substrates.

As is also well known, the conductive circuit may be formed on one or both surfaces of the substrate. Generally, this conductive circuit is formed of copper although other conductive metals may be employed including gold, silver, palladium, aluminum, and alloys thereof, depending upon the characteristics desired in the metal pattern. Various techniques may be utilized for forming the conductive layer including chemical plating or electroless deposition from a solution of the metal to be deposited, vacuum metallizing, sputtering, and the like. Of these various techniques, vacuum metallizing and electroless deposition are generally preferred. Where electroless deposition is utilized, it is generally necessary to pretreat the surface upon which the deposit is to be made so as to catalytically activate it and cause the metal ions to plate from the solution.

The intermediate coating which will bond strongly to the copper or other deposited metal and also to the underlying substrate comprises a fluid composition at room temperature containing an epoxy polymer component and rubber polymer which will interact with the epoxy polymer at an elevated temperature of at least 180° F. The rubber component must comprise at least 50 percent by weight of the epoxy polymer component, and preferably 100 to 200 percent by weight thereof. This develops a coating having an epoxy-rubber matrix with some epoxy particles dispersed within it. This is in contrast to other systems which use lower levels of rubber which produce a matrix of epoxy with rubber or epoxy-rubber particles as the second phase of a two-phase material. Moreover, the most desirable compositions are those wherein the rubber component comprises 120 to 200 percent by weight of the epoxy prepolymer.

The preferred rubber compositions are low molecular weight polyfunctional butadiene/acrylonitrile interpolymers with reactive terminal groups. These terminal groups are desirably selected from the group consisting of vinyl and carboxyl. Highly beneficial results have been obtained by use of those with vinyl groups as the chain termination and having a vinyl equivalent weight of 700 to 1500, and preferably 900 to 1300, and an acrylonitrile content of 14 to 20 percent and preferably 15 to 18 percent. The Brookfield viscosity at 27° C. ranges between 125,000 and 375,000 cps, and is preferably in the range of 200,000 to 300,000 cps. Exemplary of such a rubber component is HYCAR 1300X23 sold by the B.F. Goodrich Company of Cleveland, Ohio.

The other class of rubbers which may be utilized are those which have carboxyl terminations for the rubber chain. These will normally have an acrylonitrile content of 15 to 22 percent and preferably 16 to 20 percent, and a carboxyl content defined by an acid number of 25 to 35 and preferably 27 to 31 (or a carboxyl equivalent per hundred of about 0.045–0.060). These rubbers will generally have a Brookfield viscosity at 27° C., of 100,000 to 200,000 cps and preferably 110,000 to 160,000 cps. Exemplary of such rubbers are those sold by B.F. Goodrich Company under the designation HYCAR 1300X8. Goodrich further defines these as having a molecular weight (Mn) of 3600 and a functionality of 1.8.

Utilizing the preferred vinyl-terminated rubbers, the rubber content may desirably range from 100 to 200 percent of the epoxy polymer component. Utilizing the carboxyl terminated rubbers, the rubber content preferably comprises 50 to 120 percent by weight of the epoxy polymer component.

Other materials may be incorporated in the coating formulation in order to provide desirable characteristics including solvents to control viscosity or to assist dissolution of other components. Suitable solvents include acetone, vinyl toluene, styrene, methyl ethyl ketone, methylene chloride, methyl isobutyl ketone and ethyl glycol acetate. Glycol ether may also be used in some formulations. Fire retardants such as antimony oxide may be included, as can be various bromine compounds. Fillers such as silica can be incorporated to adjust viscosity.

High temperature curing agents for the epoxy component which provide the opportunity for two-stage curing are incorporated in the composition. Dicyandiamide has proven particularly effective, and it is readily dissolved in dimethyl formamide. Tertiary amines such as benzyldimethylamine are useful as accelerators.

The epoxy polymers are typically the reaction products of epichlorohydrin and bis-phenol A. In some instances, the reaction product may be brominated to provide inherent flame retardance. Mixtures of epoxy polymer systems may be employed so long as they are compatible, and these may desirably be utilized to produce a balance of properties including fire retardance. Typically, the epoxy polymer component will have an epoxide equivalent weight of about 410 to 480 and preferably about 415 to 450.

The viscosity of the coating composition should be adjusted depending upon the coating method to be used and the thickness desired. Generally, it will fall within the range of 3 to 60 seconds, and preferably 5 to 50 seconds, as measured with the Zahn Cup using an orifice of 0.125 inch diameter. For dip coating, the desirable flowout time for double sided circuit boards is approximately 15 to 25 seconds as so measured, and the desirable flowout time for multilayered boards is about 6 to 12 seconds as measured by the Zahn Cup.

The coatings may be applied by any suitable technique, and dip and roller coating are simple and highly effective. The coating should have a thickness of 0.0005–0.015 inch, and preferably about 0.0007–0.005 inch.

Following application of the coating to the substrate, an initial partial cure is effected to produce further polymerization of a low molecular weight rubber component if employed, to produce partial cross-linking of the epoxide, and to produce interaction of the epoxide with the rubber component. Generally, this will involve bringing the coating (and the underlying substrate) to a temperature of about 230°–300° F. for a period of 2 to 5 hours and preferably 240°–260° F. for a period of about 3 to 5 hours. Obviously, the process conditions should be selected to ensure that the coating is not fully cured and so that some degree of thermoplasticity remains.

Following the partial curing of the applied coating, the exposed surface should be etched to produce a microporous surface characteristic. Preferably and most conveniently, the etching is accomplished by a chemical etching process using oxidants such as potassium dichromate, sulfuric acid, and mixtures thereof. Alternatively, techniques such as exposure to a plasma of oxygen, ammonia or nitrogen will effect the desired roughening of the surface to produce the microporous characteristic. Other techniques which can be considered are mechanical abrasion, dispersion of readily etchable or leachable components in the coating material (and etching after its application), application of a preroughened release film onto the surface of the coating prior to its initial curing to emboss it, etc.

Following etching of the coating to provide the microporous characteristic, the conductive metal layer is deposited thereon (i) either as a uniform layer over the entire surface in which case it is subsequently etched away to leave the desired pattern, or (ii) in a pattern by providing a suitable resist to block the deposition thereof. As has been previously indicated, various techniques may be used to effect the deposition including vacuum metallizing and electroless chemical deposition which are the preferred techniques. Electroless deposition will require initial activation of the surface. The conductive metal layer will normally utilize these techniques to provide a thin conductive coating of about $10–100 \times 10^{-6}$ inch; and preferably about $50–70 \times 10^{-6}$ inch.

Because the metal layer is being deposited upon a microporous surface, the deposit will follow that surface at the interface and thus exhibit microroughness at the interface although it will be relatively smooth on its exposed face.

A photoresist pattern is generally formed thereon, and then the full thickness of the desired conductive metal pattern is developed by conventional electroplating techniques. Generally, the final thickness of the pattern will be on the order of $1.0–30.0 \times 10^{-4}$ inch, and usually about $5.0–15.0 \times 10^{-4}$.

After the conductive pattern has been fully formed by electroplating, the photoresist is removed, and the original thin metal layer is etched away between the conductive elements to expose the surface of the coating.

In accordance with the preferred process, the circuit board is subjected to a final curing operation wherein it is placed under heat and pressure to effect final curing of the coating. Generally, the temperatures required will be on the order of 280°–350° F. for a period of about 2 to 6 hours, and the pressure will normally be on the order of 1.0–300 p.s.i.g. The pressure is conveniently effected by placing the board between polished metal platens which may also be heated to effect the desired temperature. In this curing step, the coating composition flows into the microrough surface of the original metal layer of the circuit pattern to produce intimate surface contact therebetween. Thus, the coating bonds to the conductive pattern in a fashion similar to that achieved in foil/board laminating processes.

Alternatively, the partially processed circuit board may be subjected to the final curing step for the coating before the electrodeposition of the full thickness of the metal to provide the conductive pattern. The heat and pressure smooth out the exposed surface of the metal layer and at least partially embed it within the coating. This may leave small discontinuities in the metal layer which are readily filled in during the electrodeposition step. This earlier curing step appears to reduce the greater advantages mechanical adhesion achieved by embedment of a portion of the thickness of the electrodeposit in the coating, but it does appear to result in a smoother surface on the electrodeposited metal.

The exact nature of the interaction between the cross-linking epoxy polymer and rubber polymer is not fully understood. In using the preferred low molecular weight polyfunctional rubbers, a true reaction between functional groups is believed to occur. When using a high molecular weight rubber, some interaction takes place, and this may be additive at double bonds along the rubber chain, or at pendant groups and cross-linking sites. Whatever the case, the process is believed to produce a "bonding" of the epoxy to the rubber to form a product which comprises a matrix thereof in which is dispersed some epoxy polymer. Upon etching, the rubber component at the surface is still attacked by the etchant to provide the microporosity.

Depending upon the amount of polymerization in the initial curing step, and the temperature and pressure employed in the final curing step, the conductive pattern may be embedded into the coating, either in part or fully to produce a flush circuit. Desirably, the pressure is sufficient to embed the conductive pattern an amount equal to at least 10 percent of its thickness. This is believed to enhance adhesion by reason of the greater surface area in contact between the coating and the metal pattern. Whatever the case, the microporous characteristic on the surface of the coating at the time of deposition of the initial portion of the metallic layer, and the subsequent curing step produce an extremely high degree of adhesion between the metallic layer and the coating and thereby through the coating to the substrate. Peel strengths of 10-20 pounds per inch are readily and customarily attainable.

As indicated hereinbefore, the substrate may be coated on both surfaces and conductive patterns formed on both surfaces of the substrate. Moreover, multiple boards may be assembled and bonded to produce a multilayer assembly.

As previously indicated, various metals may be used in the present process. Moreover, a strike or very thin coating of a first metal, such as chromium and titanium, may be used to improve metal bonding, and then a layer of a second metal such as copper deposited thereon. This is followed by the deposition of copper or some other metal to develop the desired thickness for the conductive pattern in the circuit board.

Figure 2:
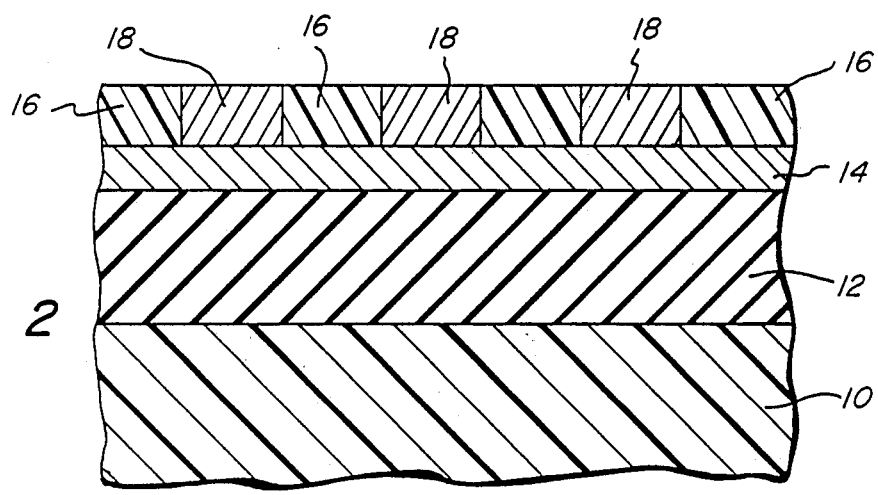
FIG. 2 is a similar view at a subsequent stage in the process of manufacture of the circuit board.
Figure 3:
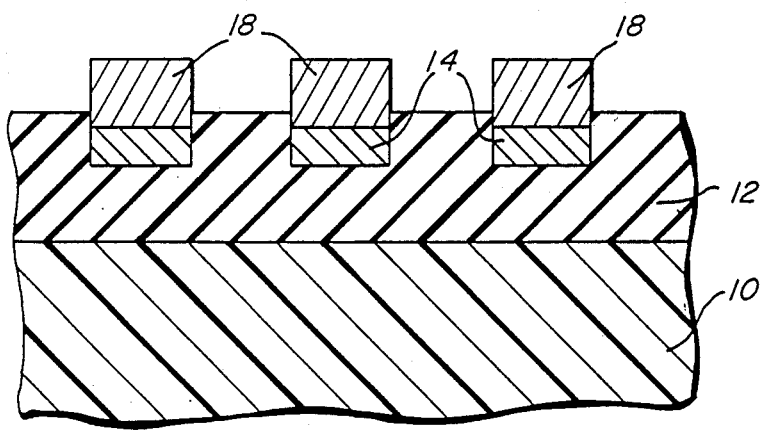
FIG. 3 is a similar view of the circuit board assembly at the final stage of manufacture.

Diagrammatically illustrative of the process as hereinbefore described is the attached drawing. In FIG. 1, the substrate is indicated by the numeral 10, the coating by the numeral 12, and the initial metal layer by the numeral 14. As seen in FIG. 2, a photoresist pattern 16 is developed on the surface of the conductive layer 14, and the electroplated, relatively thick metal deposit on the layer 14 is designated by the numeral 18. Turning now to FIG. 3, the conductive pattern 18/14 following removal of the resist 16 and etching of the layer 14 between the conductive pads 18 is partially embedded into the resin of the coating 12 by the application of heat and pressure.

Exemplary of the present invention are the following specific examples wherein all parts are parts by weight unless otherwise indicated.

EXAMPLE ONE

The base material or substrate is a general purpose rated epoxy/glass laminate approximately 0.060 inch in thickness. A coating formulation of the following composition is dip coated to a thickness of $2.0\text{-}2.5 \times 10^{-3}$ inch:
Epoxy resin: 70.0
Dicyandiamide: 2.0
Benzyldimethylamine: 0.5
Rubber (HYCAR 1300X23 Goodrich): 110.0
Silica: 10.0
Glycol ether: 42.0
Acetone: 53.0
Dimethylformamide: 8.0

After application, the coating is partially cured at 250° F. for a period of 4 hours in a forced air oven.

The base material with the partially cured coating is then subjected to an etching treatment to render the surface microporous by an etching solution containing potassium dichromate, sulfuric acid, orthophosphoric acid, and water. To achieve the desired degree of etching, the coated base material is immersed in the etching solution for 3.5 minutes with the solution having a temperature of 40° C. This process step removes part of the acrylonitrile rubber from the surface of the coating.

After drying, a thin coating of copper is then applied to the coated base material by vacuum metallizing to a thickness of $50\text{-}70 \times 10^{-6}$ inch. A photoresist is then exposed and developed to produce the desired circuit pattern, following which the pattern is plated to the required copper thickness of approximately 1 oz. per square foot. The resist is then removed and the thin, initial copper layer is removed by etching in a ferric chloride solution.

At this stage, the board is placed under contact pressure between two steel plates and placed in an oven at 290° F. for a period of about 4 hours. During this period, the partially cured coating reflows and bonds to the copper circuit pattern so that the final bond is effected by the adhesion of the reflowing coating to the microroughened initial copper layer to produce a peel strength of about 12 lb/in.

EXAMPLE TWO

After preparation of the base material in accordance with Example One, a coating the following formulation is applied:
Epoxy resin: 70.0
Dicyandiamide: 2.0
Benzyl dimethylamine: 0.5
Rubber (HYCAR 1300X8 Goodrich): 45.0
Silica: 10.0
Glycol ether: 67.0
Dimethylformamide: 8.0

Initial curing of this system is effected at 290° F. for a period of 4 hours, and the final cure is effected for 5 hours at 300° F.

The remaining steps of Example One are repeated.

EXAMPLE THREE

An FR-4 type epoxy/glass substrate is used and the coating in the process of Example One has the following formula to retain the fire rating:
Epoxy resin: 10.0
Brominated epoxy resin: 62.5
Dicyandiamide: 2.0
Benzyl dimethylamine: 0.5
Rubber (HYCAR 1300X23 Goodrich): 115.0
Silica: 10.0
Antimony oxide: 3.0
Acetone: 42.0
Dimethyl formamide: 8.0

EXAMPLE FOUR

In a modification of the process described in the preceding examples, the final curing step is effected after the deposition of the initial metal layer and before electrodeposition of the metal to provide the full thickness of the pattern.

The process as set forth in Example One is substantially repeated except that the coating has a thickness of about $1.5-2.0 \times 10^{-3}$ inch, and the final curing step is effected after the formation of the vacuum metallized deposit by subjecting the partially processed board to a temperature of 280° F. for 3 hours at 250 p.s.i. After the application of the heat and pressure in this step, the vacuum metallized deposit appears to be substantially embedded in the coating.

After electroplating, the surface of the conductive pattern appears smooth, and the peel strength is found to be 12.6 lb/in.

Thus, it can be seen from the foregoing detailed specification and examples, that the process of the present invention provides a relatively simple but highly effective technique for achieving good bonding between a deposited metal layer and an underlying resinous substrate. Peel strengths of 10–20 lb/in. are readily and uniformly attainable due to the excellent adhesion afforded by the coating which may be characterized as an epoxy filled and modified rubber polymer. Good line definition and close spacing can be readily attained due to the ease with which the process may be practiced and the bond strengths which may be attained.

Having thus described the invention, what is claimed is:

1. In a process for producing circuit boards having a metallized circuit pattern firmly bonded to a resinous substrate, the steps comprising:
   (a) coating a resinous substrate with a fluid mixture of a formualtion containing;
      (i) a low molecular weight polyfunctional reactive rubber component comprising an interpolymer of butadiene and acrylonitrile; and
      (ii) an epoxy polymer component, said components being interactive at temperatures of at least 180° F., said rubber component comprising 50–200 percent by weight of the epoxy polymer component, said coating having a thickness of 0.0005–0.015 inch;
   (b) partially curing the coating to produce partial cross-linking of said epoxy polymer component, further polymerization of the rubber, and interaction of said rubber and epoxy polymer components;
   (c) etching the exposed surface of the coating to produce a microporous surface;
   (d) depositing metal on the microporous surface of the coating to form a conductive layer with microformations extending into the recesses of said microporous surface;
   (e) applying heat and pressure to said conductive layer and coating to fully cure said coating, thereby firmly bonding said coating to said metal layer and thereby said conductive layer through said coating to said resinous substrate; and
   (f) electrodepositing metal on said conductive layer to form a conductive pattern therewith, said conductive pattern being bonded firmly to said substrate through said conductive layer and coating.

2. The process in accordance with claim 1 wherein said rubber interpolymer has terminal functional groups selected from vinyl and carboxyl.

3. The process in accordance with claim 1 wherein said rubber interpolymer has a Brookfield viscosity of 100–400,000 cps at 27° C.

4. The process in accorance with claim 1 wherein said functional terminals groups interact with the epoxy polymer component during curing thereof.

5. The process in accordance with claim 1 wherein said etching step utilizes a chemical etchant to attack the exposed surface of said coating and produce the microporous characteristic.

6. The process in accordance with claim 1 wherein said etching step utilizes a plasma to attack the exposed surface of said coating and produce the microporous characteristic.

7. The process in accordance with claim 1 wherein said metal layer is deposited by a process of vacuum metallizing.

8. The process in accordance with claim 1 wherein said metal layer is deposited by electroless chemical deposition from a metallic solution.

9. The process in accordance with claim 1 wherein said terminal functional group is a vinyl group and wherein said rubber component comprises 100–200% by weight of the epoxy prepolymer component.

10. The process in accordance with claim 1 wherein said step or partially curing the coating comprises developing a temperature of 250°–350° F. in the coating for a period of at least 2 hours, and wherein said step of fully curing the coating comprises developing a temperature in the coating of 280°–350° F. for a period of at least 2 hours.

11. The process in accordance with claim 1 wherein said step of applying heat and pressure at least partially embeds said conductive layer in the coating.

12. The process in accordance with claim 1 wherein a continuous layer of metal is initially deposited on said coating and thereafter selectively etched to remove said layer between said elements of said conductive pattern.

13. In a process for producing circuit boards having a metallized circuit pattern firmly bonded to a resinous substrate, the steps comprising:
   (a) coating a resinous substrate with a fluid mixture of a formulation containing a rubber component and an epoxy polymer component which are interactive at temperatures of at least 180° F., said rubber component comprising 50–200 percent by weight of the epoxy polymer component, said coating having a thickness of 0.0005–0.0015 inch;
   (b) partially curing the coating to produce partial cross-linking of said eopxy polymer component, and interaction of said rubber component and epoxy polymer components to form a matrix of the interacted rubber and epoxy components;
   (c) etching the exposed surface of the coating to produce a microporous surface;
   (d) depositing metal on said microporous surface of the coating to form a conductive layer with microformations extending into the recesses of said microporous surface;
   (e) applying heat and pressure to said conductive layer and coating to fully cure said coating, thereby firmly bonding said coating to said conductive layer and thereby said conductive layer through said coating to said resinous substrate, said heat and pressure embedding said conductive layer in said coating; and
   (f) electrodepositing metal on said conductive layer to form a conductive pattern therewith.

14. The process in accordance with claim 13 wherein said rubber component has functional terminal groups which interact with the epoxy prepolymer component during said metal curing step.

15. The process in accordance with claim 13 wherein said etching step utilizes a chemical etchant to attack the exposed surface of said coating and produce the microporous characteristic.

16. The process in accordance with claim 13 wherein said a conductive layer is deposited by a process of vacuum metallizing.

17. The process in accordance with claim 13 wherein said rubber component is a low molecular weight polyfunctional reactive rubber comprising a interpolymer of butadiene and acrylonitrile which is terminated by a functional vinyl group and wherein said rubber component comprises 100–200% by weight of the epoxy polymer component.

18. The process in accordance with claim 17 wherein said rubber interpolymer has terminal functional groups selected from vinyl and carboxyl.

19. In a circuit board, the combination comprising:
(a) a resinous substrate;
(b) an intermediate coating on one surface of said substrate of about 0.0005–0.015 inch and containing a rubber component and an epoxy polymer which have interacted to provide a matrix of the interacted rubber/epoxy polymer, said rubber component comprising at least 35 percent by weight of said coating; and
(c) a metal conductive pattern on said coating providing a circuit, said conductive pattern having a base metal layer with microformations at the interface with said coating an extending thereinto, said conductive pattern being embedded in said coating to a depth substantially equal to the thickness of said base metal layer, said coating being firmly bonded to said base metal layer and said conductive pattern thereby being bonded through said coating and base metal layer to said substrate.

20. The circuit board in accordance with claim 19 wherein said circuit board is produced by a process comprising the steps of:
(a) coating a resinous substrate with a fluid mixture of a formulation containing a rubber component and an epoxy polymer component which are interactive at temperatures of at least 180° F., said rubber component comprising 50–200 percent by weight of the epoxy polymer component in said formulation, said coating having a thickness of 0.0005–0.015 inch and containing at least 35 percent by weight of said rubber component;
(b) partially curing the coating to produce partial cross-linking of said epoxy polymer component, and interaction of said rubber and epoxy polymer components to form a matrix of the interacted rubber and epoxy components;
(c) etching the exposed surface of the coating to produce a microporous surface;
(d) depositing metal on said microporous surface of the coating to form a conductive layer with microformations extending into the recesses of said microporous surface;
(e) applying heat and pressure to said conductive pattern and coating to fully cure said coating, therby firmly bonding said coating to said conductive layer and thereby said conductive layer through said coating to said resinous substrate, said heat and pressure embedding said conductive layer in said coating; and
(f) electrodepositing metal on said conductive layer to form a conductive pattern therewith.

21. The circuit board of claim 20 wherein said rubber component is a rubbery polymer with terminal functional groups selected from vinyl and carboxyl.

22. The circuit board of claim 21 wherein said rubbery polymer has a Brookfield viscosity of 100–400,000 cps at 27° C.

23. The cirucit board of claim 20 wherein said rubber component is a low molecular weight polyfunctional reactive rubber comprising an interpolymer of butadiene and acrylonitrile which is terminated by a functional vinyl group and wherein said rubber component comprises 100–200% by weight of the epoxy polymer component.

24. The circuit board of claim 19 wherein said rubber component comprises at least 50 percent by weight of said coating.

* * * * *

UNITED STATES PATENT AND TRADEMARK OFFICE
CERTIFICATE OF CORRECTION

PATENT NO. : 4,797,508
DATED : January 10, 1989
INVENTOR(S) : Peter R. Chant

It is certified that error appears in the above-identified patent and that said Letters Patent is hereby corrected as shown below:

Column 10, line 20 "or" should be -- of --;
line 42 "0.0015" should be -- 0.015 --;
line 44 "eopxy" should be -- epoxy --;
line 65 "component" should be -- components --;

Column 11, line 4 after "said", delete "a";
line 28 "an" should be -- and --.

Signed and Sealed this

Twenty-second Day of August, 1989

Attest:

DONALD J. QUIGG

*Attesting Officer*      *Commissioner of Patents and Trademarks*